United States Patent
Weng et al.

(10) Patent No.: US 7,135,405 B2
(45) Date of Patent: Nov. 14, 2006

(54) METHOD TO FORM AN INTERCONNECT

(75) Inventors: Jian-Gang Weng, Corvallis, OR (US); Ravi Prasad, Corvallis, OR (US); Cary G. Addington, Albany, OR (US); Peter S. Nyholm, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/912,442

(22) Filed: Aug. 4, 2004

(65) Prior Publication Data

US 2006/0030141 A1     Feb. 9, 2006

(51) Int. Cl.
*H01L 39/00* (2006.01)

(52) U.S. Cl. ........................ 438/662; 438/940

(58) Field of Classification Search ........... 438/463, 438/662, 940
See application file for complete search history.

(56) References Cited

U.S. PATENT DOCUMENTS

| | | | |
|---|---|---|---|
| 5,236,551 A * | 8/1993 | Pan | 216/19 |
| 5,262,718 A * | 11/1993 | Svendsen et al. | 324/754 |
| 6,121,130 A * | 9/2000 | Chua et al. | 438/623 |
| 6,228,685 B1 * | 5/2001 | Beroz et al. | 438/116 |
| 6,344,662 B1 | 2/2002 | Dimitrakopoulos et al. | |
| 6,602,790 B1 | 8/2003 | Kian et al. | |
| 6,620,731 B1 | 9/2003 | Farnworth | |
| 6,858,461 B1 * | 2/2005 | Oswald et al. | 438/68 |
| 6,861,377 B1 | 3/2005 | Hirai | |
| 6,867,081 B1 * | 3/2005 | Weng et al. | 438/197 |
| 2003/0047729 A1 | 3/2003 | Hirai et al. | |
| 2003/0054579 A1 | 3/2003 | Pakbaz et al. | |
| 2003/0160235 A1 | 8/2003 | Hirai | |
| 2003/0164915 A1 | 9/2003 | Fujiwara et al. | |
| 2003/0211649 A1 * | 11/2003 | Hirai et al. | 438/48 |
| 2003/0224152 A1 | 12/2003 | Yokoyama | |
| 2004/0009304 A1 | 1/2004 | Pichler et al. | |
| 2004/0147113 A1 | 7/2004 | Yamazaki | |

FOREIGN PATENT DOCUMENTS

| | | |
|---|---|---|
| EP | 0 357 124 | 3/1990 |
| JP | 2004-006700 | 1/2004 |

\* cited by examiner

*Primary Examiner*—S. V. Clark (57) ABSTRACT

Embodiments of methods, apparatuses, devices, and/or systems for forming an interconnect are described.

23 Claims, 4 Drawing Sheets

METHOD TO FORM AN INTERCONNECT

BACKGROUND

Electronic devices, such as integrated circuits, solar cells, and/or electronic displays, for example, may be comprised of one or more electrical devices. Methods of forming interconnects for devices may vary. Although particular processes may vary, one or more processes used may have particular disadvantages. For example, such processes may be time-consuming and/or expensive, may not allow for the use of particular materials, and/or may not produce the desired results.

BRIEF DESCRIPTION OF THE DRAWINGS

Subject matter is particularly pointed out and distinctly claimed in the concluding portion of the specification. Claimed subject matter, however, both as to organization and method of operation, together with objects, features, and advantages thereof, may best be understood by reference of the following detailed description when read with the accompanying drawings in which:

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail so as not to obscure claimed subject matter.

Electronic devices, such as semiconductor devices, display devices, nanotechnology devices, conductive devices, and/or dielectric devices, for example, may be comprised of one or more thin films, which may additionally be referred to as layers. In this context, the term thin film refers to a material formed to a thickness, such that surface properties of the material may be observed, and these properties may vary from bulk material properties, for example. These one or more layers may be further comprised of one or more materials, and the one or more materials may have electrical and/or chemical properties, such as conductivity, optical properties, such as a transparency and/or refractive index, and/or a density, for example. The one or more material layers may additionally be patterned, and, in combination with one or more other patterned material layers, may form one or more electronic devices, such as thin films transistors (TFT), capacitors, diodes, resistors, photovoltaic cells, insulators, conductors, optically active devices, or the like. Thin film devices, such as TFTs, in particular, may, for example, be utilized in display devices including, for example, an electroluminescent and/or a liquid crystal displays (LCD). Thus, a substrate patterned to form one or more thin film transistors may form a portion of an electronic device, such as a display device, for example.

At least as part of the fabrication process of electronic devices, such as thin film devices, including, for example, thin film transistors, one or more electrodes may be formed at least as part of one or more of the device layers. In at least one embodiment, one or more gate, drain and/or source electrodes may be formed on one or more device layers. In this embodiment, as at least a part of the fabrication process, one or more of these electrodes may be coupled to one or more other electrodes, such as one or more other electrodes formed at least as part of the one or more device layers, for example. One or more electrodes may be coupled to one or more other electrodes, such as electrically by use of an interconnect formed at least partially in a via, to form a transistor, for example. Additionally, one or more electrodes may be coupled to one or more other devices, such as one or more additional thin film transistors to form a circuit, including coupling an electrode of one thin film transistor, such as a source electrode, to an electrode of another thin film transistor, such as a gate electrode, as just an example, such as when assembled into an electronic device, for example.

In one particular embodiment, a hole, such as a via, may be formed through one or more thin films, such as to expose a portion of one or more electrodes, for example. An interconnect may then be formed at least partially in the via, and may result in the coupling of two or more electrodes, for example. Numerous methods may exist or be developed for forming interconnects and/or vias that are within the scope of one or more embodiments of claimed subject matter. In at least one embodiment, for example, one or more subtractive processes in combination with one or more additive processes, such as one or more etching processes followed by one or more deposition processes, may be utilized to form an interconnect at least partially in a via, such as on a multilayer device, for example. However, depending at least in part on the type of material or combination of materials utilized to form one or more layers of a device, one or more processes, such as etching, for example, may damage or render at least partially inoperable one or more portions of a device, such as through contamination, for example. Additionally, depending at least in part on the type of material used to form interconnects, one or more heating operations may be utilized to cure the material, for example, and these one or more heating operations may damage one or more portions of a device if the portions are heated beyond a particular temperature, for example.

Although claimed subject matter is not so limited, in one particular embodiment, an electronic device, such as a thin film device, may comprise at least one interconnect providing coupling between two or more electrodes of one or more devices, and an interconnect may be formed by removing at least a portion of at least one device layer by use of a device capable of providing electromagnetic radiation, such as a laser, and providing one or more conductive materials to at least a portion of at least one device layer, such as in the vicinity of the removed portion, by use of one or more ejection processes, such as performed by an ejection device including a jetting device, such as an ink jet device, for example. As used herein, conductive, when used, such as with conductive materials, generally refers to the capability to at least partially conduct electricity, and may comprise a structure that is conductive, semiconductive, or partially conductive, for example. Additionally, as used herein, an ejection device, such as a jetting device, including an ink jet device, may comprise a mechanism capable of ejecting material such as ink, for example, and may eject material in the form of drops, for example, such as mechanically and/or electrically, and/or in response to electrical signals, and may be capable of ejecting material in controlled portions, in a controlled manner, and/or in a controlled direction, for example. Additionally, an ejection device may operate by use of one or more ejection schemes, including piezo ejection, thermal ejection, and/or flex tensioned ejection, for example, but, again, claimed subject matter is not limited to these examples.

Figure 1A:
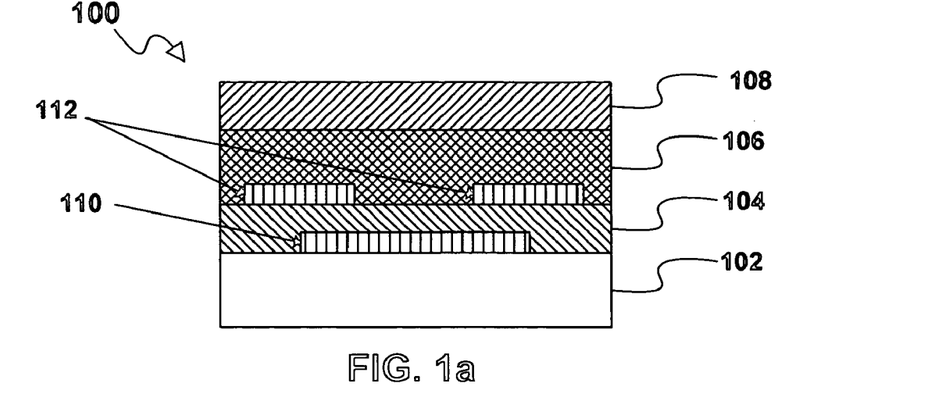
FIG. 1a is a cross-sectional view of one embodiment of a device in one stage of formation in accordance with one embodiment of a method for forming an interconnect.

Referring now to FIG. 1a, there is illustrated a cross-sectional view of one embodiment 100 of an electronic device in a stage of formation. Embodiment 100, here, comprises substrate 102, with a device layer 104 formed thereon, which may comprise a dielectric layer, such as a gate dielectric layer, for example. Additionally, in this embodiment, formed on a portion of substrate 102 is an electrode, such as gate electrode 110. A plurality of electrodes 112 may be formed on at least a portion of device layer 104, and, in at least one embodiment, may comprise drain, gate and/or source electrodes, for example. Additionally, in this embodiment, formed on at least a portion of device layer 104 is device layer 106, which may comprise a semiconductive layer, in at least one embodiment. Additionally, formed on at least a portion of device layer 106 is a device layer 108, which, in at least one embodiment, may comprise a dielectric, passivation and/or protection layer, for example, although claimed subject matter is not so limited, as explained in more detail later. It is noted, of course, here and through out this description that claimed subject matter is not limited to the foregoing layers being formed on one another. For example, other layers may be included, such as between various layers, so that layers may be formed above one another rather than on one another, depending, for example, on the particular embodiment.

Although claimed subject matter is not limited to any particular material and/or combination of materials to form one or more of the layers and/or devices illustrated in FIG. 1a, in at least one embodiment, substrate 102 may comprise a substrate of glass and/or plastic, as just a few examples, and may additionally comprise any combination of materials, such as polycarbonate, polyacrylate, polyimide, polyolefin, polyestersulfone, polyester, polyethylene terephthalate (PET), polyethylene naphthalate (PEN), and/or polyethersulfone (PES), but it is desirable to note that claimed subject matter is not limited in this respect, and may comprise any material suitable for use as a substrate, such as any material exhibiting properties suitable for application as a substrate in an electronic device, for example. In one particular embodiment, a substrate may comprise a material or combination of materials that are typically lower cost as compared to other types of materials, and these particular lower cost substrates may be particularly sensitive to high temperatures. For example, one particular material suitable for use as a substrate in at least one embodiment may substantially comprise polyester, and this particular substrate may not be suitable for use in environments where the temperature may exceed 200 degrees Celsius, for example. Of course, as stated previously, claimed subject matter is not limited in this respect. Additionally, device layer 104 may comprise a layer substantially comprising dielectric material, and may comprise organic and/or inorganic material, for example. In at least one embodiment, device layer 104 may comprise one or more organic dielectrics such as poly (vinylphenol), also called PVP, and/or one or more inorganic dielectrics, such as a metal oxide, including $Al_2O_3$ and/or $SiO_2$, which may be in sol-gel and/or nanoparticle forms, as just a few examples. Additionally, electrodes 110 and/or 112 may be comprised of one or more types of materials, such as organic and/or inorganic materials, including poly(3,4-ethylenedioxythiophene), also called PEDOT, and/or one or more types of metal in nanoparticle suspensions and/or organo-metallic solutions, such as Cu, Al, Ni, and/or Cr, as just a few examples. Additionally, device layer 106 may be comprised of one or more organic and/or inorganic semiconductive materials, including, for example, poly (3-hexylthiophene-2,5-diyl) in chloroform, pentacene, silicon, ZnO and/or CdSe, as just a few examples. Additionally, device layer 108 may comprise a layer substantially comprising dielectric material, and may comprise organic and/or inorganic material, for example. In at least one embodiment, device layer 108 may comprise one or more organic dielectrics, such as PVP and/or acrylic, and/or one or more inorganic dielectrics, such as a metal oxide, including $Al_2O_3$ and/or $SiO_2$, which may be in sol-gel and/or nanoparticle forms, as just a few examples.

Formation of one or more layers of device 100 may comprise one or more processes, and/or numerous process operations, but claimed subject matter is not limited to any particular method of formation of one or more layers and/or one or more electrodes of device 100. However, in at least one embodiment, one or more deposition processes, such as one or more thermal evaporation, sputter, chemical vapor deposition (CVD), electro-plating, electroless plating, inkjet printing, screen printing, and/or spin coating deposition processes may be utilized, and/or one or more patterning processes, for example, but again, claimed subject matter is not so limited. Particular methods of formation of the devices illustrated herein may be better understood when explained with reference to FIG. 4, below.

Figure 1B:
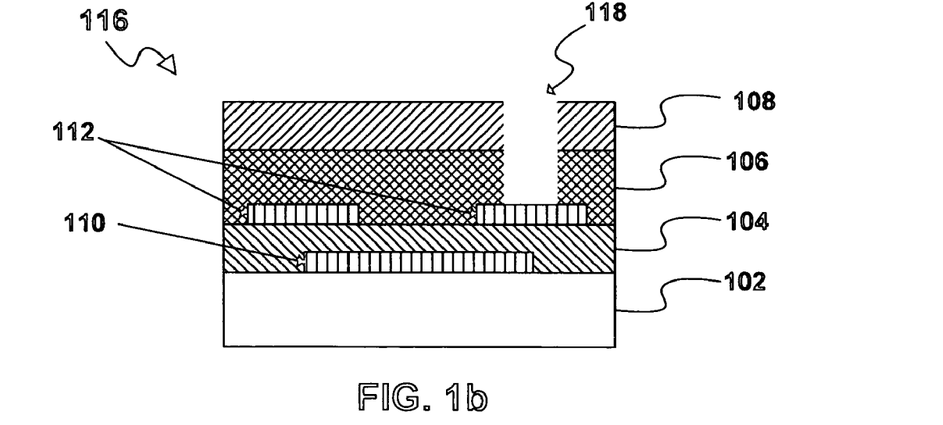
FIG. 1b is a cross-sectional view of one embodiment of a device in another stage of formation in accordance with one embodiment of a method for forming an interconnect.

As stated previously, one or more portions of a device, such as one or more electrodes of thin film device 100, may be interconnected to one or more other electrodes, such as one or more electrodes of thin film device 100, and/or to one or more electrodes of one or more other devices (not shown) at least as part of the fabrication process. In at least one embodiment, one or more electrodes 110 and/or 112 may be electrically coupled to electrodes of other devices, for example, to form a circuit, such as an electrical circuit comprising a plurality of thin film transistors, for example. As illustrated in FIG. 1b, at least a portion of one or more materials forming device 100 may be removed, such as selectively, such that one or more electrodes may be provided with an interconnect to an external device (not shown) or to one or more other electrodes, for example. In at least one embodiment, connectivity may be provided by use of conductive material, applied at least partially in a formed hole or via, for example. Illustrated in FIG. 1b is device 116, which here comprises device 100 with at least a portion selectively removed, such as to form a via 118. In at least one embodiment, one or more subtractive processes may be performed to remove at least a portion of device 116 to form a via 118. In one particular embodiment, electromagnetic radiation may be utilized to remove at least a portion of one or more layers, and may comprise one or more laser ablation processes, for example. In this embodiment, one or more laser ablation processes may be utilized to remove at least a portion of layers 106 and/or 108, for example, such as to expose at least a portion of at least one electrode, such as at least one electrode 112, for example, resulting in the creation of a via 118, for example. In this embodiment, a laser (not shown) may be configured to provide electromagnetic radiation to at least a portion of device 116, which may result in laser ablation of at least a portion of device 116, for example. Laser ablation, in this context, refers generally to the effects of incident electromagnetic radiation imparted by a laser on one or more types of materials. For example, although claimed subject matter is not so limited, laser radiation incident on glass and/or plastic materials may result in vaporization of a portion of material, for example, and particular polymer materials may undergo chemical changes, such as photochemical changes, including decomposition, for example. The effects of laser radiation on one or more particular types of materials may depend upon particular laser and/or material characteristics such as, for example, the fluence, wavelength, intensity, peak power, and/or duration of the laser radiation as applied to the materials, as well as other factors, such as the absorptivity and absorption depth of the materials, for example. In this embodiment, the particular characteristics of the laser utilized to perform one or more selective removal processes may depend at least in part on the type of material or combination of materials used to form one or more device layers, and one or more laser characteristics may be varied during the removal process, if, for example, differing materials were used to form one or more device layers or if different effects are desired during the process, for example. In one particular embodiment, a laser having a wavelength of approximately 248 nanometers may be utilized to at least partially form a via in a material layer substantially comprising PVP, for example, although, of course, claimed subject matter is not so limited. Removal processes may be better understood when explained with reference to FIG. 4, below.

Figure 1C:
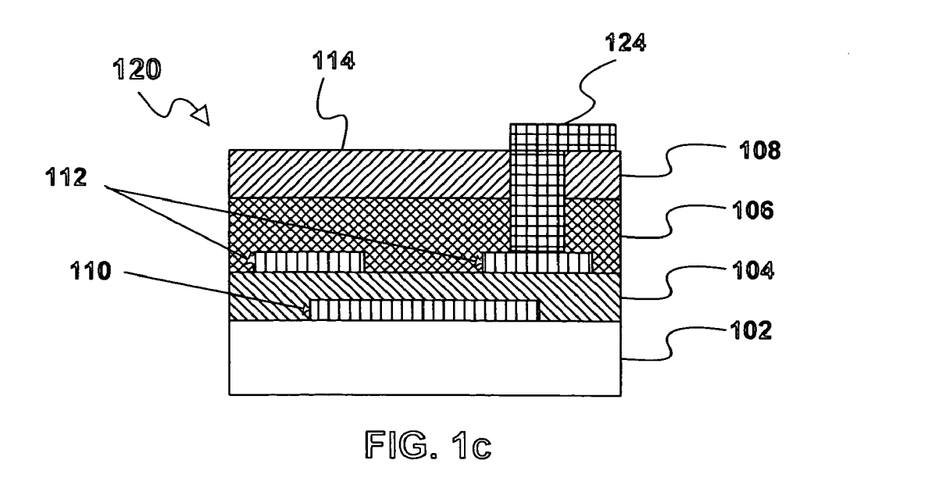
FIG. 1c is a cross-sectional view of one embodiment of a device in yet another stage of formation in accordance with one embodiment of a method for forming an interconnect.

Continuing with this embodiment, and as illustrated by FIG. 1c, at least a portion of via 118 of FIG. 1b may be provided with material, such as conductive material, for example, resulting in the formation of interconnect 124, in at least one embodiment. In this embodiment, an interconnect 124 may be formed to be electrically coupled with one or more electrodes, such as electrodes 112 and/or 110, for example, and, as a result, may provide an interconnection between one or more electrodes, such as 112 and/or 110, for example, and one or more additional devices (not shown), such as one or more additional transistors, which may be coupled to interconnect 124, such as in a later processing operation, to form a circuit, for example. In this embodiment, one or more additive processes may be performed to form interconnect 124, such as one or more deposition processes, for example. In at least one embodiment, an ejection device, such as a jetting device, including, for example, an ink jet device, may provide material to at least partially form interconnect 124, such as by ejecting material at least partially in to via 118, for example. Additionally, depending at least in part on the material and/or combination of materials used to form interconnect 124, one or more lasers may be utilized to apply electromagnetic radiation, such as laser radiation to the one or more materials provided by the ejection device, which may be referred to as curing in this context. For example, metallic nanoparticle suspensions and/or organo-metallic solutions may be cured at least as part of the formation process, as just an example. In this embodiment, material may be provided at least partially to via 118, and, after a particular amount of material is provided, a laser may provide laser radiation to the material, which may result in at least a portion of the material being altered, such as physically and/or chemically, such as by re-crystallization, sintering and/or decomposition, for example. Sintering, when used in this context, refers generally to a process wherein multiple portions of a material, such as a metal material in the form of nanoparticles, for example, may become a substantially singular mass, as a result of melting and re-crystallization, such as result from laser heating, for example, and may additionally be referred to as curing, as stated previously. Although numerous differing types of materials may be utilized to form interconnections, in at least one embodiment, at least one material may comprise one or more types of materials, such as organic and/or inorganic materials, including poly(3,4-ethylenedioxythiophene), also called PEDOT, and/or one or more types of metal in nanoparticle suspensions, such as, for example, Cu, Al, Ni, and/or Cr, and/or organo-metallic compound solution, such as Cu formate hydrate in water, as just a few examples. In at least one embodiment, one or more materials may comprise a suspension of nanoparticles in solvent, such as a nanoparticle suspension comprising 30% by weight of gold nanoparticles suspended in toluene, and one or more sintering processes may be utilized to at least partially form an interconnect, for example. Again, particular methods of formation may be better understood when explained with reference to FIG. 4 below.

Figure 2A:
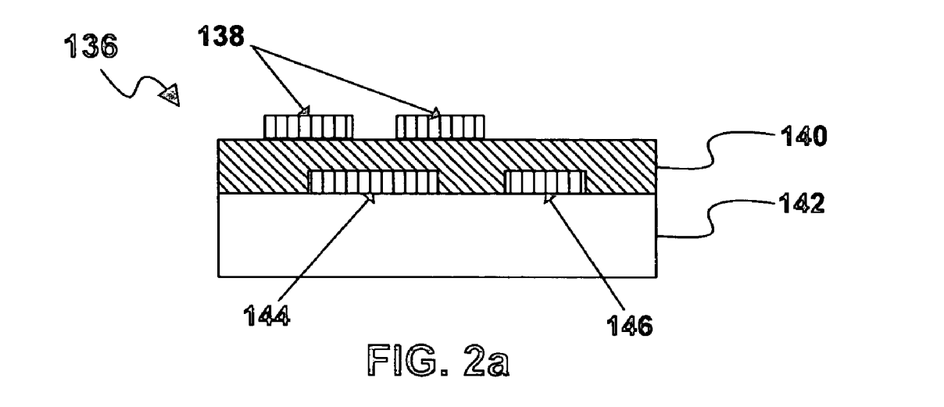
FIG. 2a is a cross-sectional view of another embodiment of a device in one stage of formation in accordance with one embodiment of a method for forming an interconnect.

Referring now to FIG. 2a, there is illustrated a cross-sectional view of another embodiment 136 of an electronic device in a stage of formation. Embodiment 136, here, comprises substrate 142, with a dielectric layer 140 formed thereon, which may comprise a dielectric layer, such as a gate dielectric layer, for example. Additionally, in this embodiment, formed on a portion of substrate 142 is an electrode, such as gate electrode 144, as well as a gate connector electrode 146, which will at least partially provide connectivity to another electrode, explained in more detail later. Additionally, formed on at least a portion of dielectric layer 140 are electrodes 138, which may comprise source and/or drain electrodes, for example.

Although claimed subject matter is not limited to any particular material and/or combination of materials to form one or more of the layers and/or devices illustrated in FIG. 2a, in at least one embodiment, substrate 142 may comprise a substrate of glass and/or plastic, as just a few examples, and may additionally comprise any combination of materials, such as polycarbonate, polyacrylate, polyimide, polyolefin, polyestersulfone, polyester, polyethylene terephthalate (PET), polyethylene naphthalate (PEN), and/or polyethersulfone (PES), but it is desirable to note that claimed subject matter is not limited in this respect, and may comprise any material suitable for use as a substrate, such as any material exhibiting properties suitable for application as a substrate in an electronic device, for example. Dielectric layer 140 may comprise a layer substantially comprising dielectric material, and may comprise organic and/or inorganic material, for example. In at least one embodiment, device layer 140 may comprise one or more organic dielectrics, such as poly(vinylphenol), also called PVP, and/or one or more inorganic dielectrics, such as a metal oxide, including $Al_2O_3$ and/or $SiO_2$, for example, which may be in sol-gel and/or nanoparticle form, as just a few examples. Additionally, electrodes 144, 146 and/or 138 may be comprised of one or more types of materials, such as organic and/or inorganic materials, including poly(3,4-ethylenedioxythiophene), also called PEDOT, and/or one or more types of metal in nanoparticle suspensions, such as Cu, Al, Ni, and/or Cr and/or organo-metallic compound solution, such as Cu formate hydrate in water, as just a few examples.

Figure 2B:
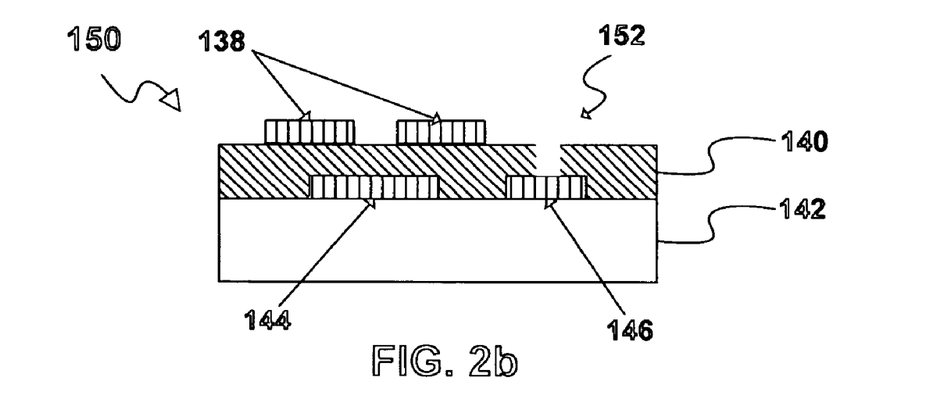
FIG. 2b is a cross-sectional view of another embodiment of a device in another stage of formation in accordance with one embodiment of a method for forming an interconnect.

As stated previously, one or more components of a device, such as device 136, may be interconnected at least as part of the fabrication process. In at least one embodiment, one or more electrodes 144, 146 and/or 138 may be interconnected, for example, in order to form a device, such as a transistor, for example. As illustrated in FIG. 2*b*, at least a portion of one or more materials forming device 136 may be removed, such as selectively, such that one or more electrodes may be provided with an interconnect to an external device (not shown), such as one or more additional transistors, for example, by use of conductive material applied at least partially in a via, for example. Illustrated in FIG. 2*b* is device 150, which comprises device 136 with at least a portion selectively removed, such as to form via 152. In at least one embodiment, one or more subtractive processes may be performed to remove at least a portion of device 136 to form via 152. In one particular embodiment, electromagnetic radiation may be utilized to remove at least a portion of one or more layers, and may comprise one or more laser ablation processes, for example. In this embodiment, one or more laser ablation processes may be utilized to remove at least a portion of layer 140, for example, such as to expose at least a portion of at least one electrode, such as gate connector electrode 146, for example, resulting in the creation of via 152, for example. In this embodiment, a laser (not shown) may be configured to provide electromagnetic radiation to at least a portion of dielectric layer 140, which may result in laser ablation of at least a portion of layer 140, for example.

Figure 2C:
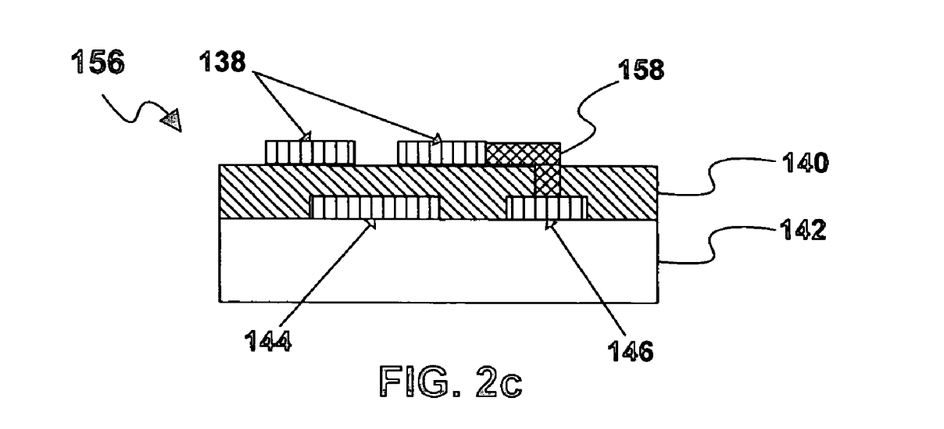
FIG. 2c is a cross-sectional view of another embodiment of a device in yet another stage of formation in accordance with one embodiment of a method for forming an interconnect.

Continuing with this embodiment, and as illustrated by FIG. 2*c*, at least a portion of via 152 of FIG. 2*b* may be provided with material, such as conductive material, for example, resulting in the formation of interconnect 158, in at least one embodiment. In this embodiment, interconnect 158 may be formed to be electrically coupled with one or more electrodes, such as gate connector electrode 146 coupled with electrode 138, for example. In this embodiment, one or more additive processes may be performed to form interconnect 158, such as one or more deposition processes, for example. In at least one embodiment, an ejection device, such as a jetting device, including an ink jet device, for example, may provide material to at least partially form interconnect 158, such as by ejecting material at least partially in to via 152, for example. Additionally, depending at least in part on the material and/or combination of materials used to form interconnect 158, one or more lasers may be utilized to apply electromagnetic radiation, such as laser radiation to the one or more materials provided by the ejection device. For example, metallic nanoparticles and/or organo-metallic compound may be cured at least as part of the formation process, as just an example. In this embodiment, material may be provided at least partially to via 152, and, after a particular amount of material is provided, a laser may provide laser radiation to the material, which may result in at least a portion of the material being altered, such as physically and/or chemically, such as by re-crystallization, sintering and/or decomposition, for example. Although numerous differing types of materials may be utilized to form interconnections, such as interconnect 158, in at least one embodiment, at least one material may comprise may one or more types of materials, such as organic and/or inorganic materials, including poly(3,4-ethylenedioxythiophene), also called PEDOT, and/or one or more types of metal in nanoparticle suspensions, such as Cu, Al, Ni, and/or Cr and/or organo-metallic solutions, such as Cu formate hydrate in water, as just a few examples. In at least one embodiment, one or more materials may comprise a suspension of nanoparticles in solvent, such as a nanoparticle suspension comprising 30% by weight of gold nanoparticles suspended in toluene, and one or more sintering processes may be utilized to at least partially form an interconnect, for example.

Additionally, although claimed subject matter is not limited in this respect, at least a portion of device 156 may be provided with one or more materials, such as to form one or more material layers, such as one or more semiconductive layers, in at least one embodiment, and/or one or more dielectric and/or protection layers, as just a few examples. Formation of one or more devices 136, 150 and/or 156 may comprise one or more processes, and/or numerous process operations, but claimed subject matter is not limited to any particular method or combination of methods. However, in at least one embodiment, one or more deposition processes, such as one or more thermal evaporation, sputter, chemical vapor deposition (CVD), electro-plating, electroless plating, inkjet printing, screen printing, and/or spin coating deposition processes may be utilized, and/or one or more patterning processes, for example, but again, claimed subject matter is not so limited. Additionally, particular methods of formation may be better understood when explained in reference to FIG. 4, below.

Figure 3:
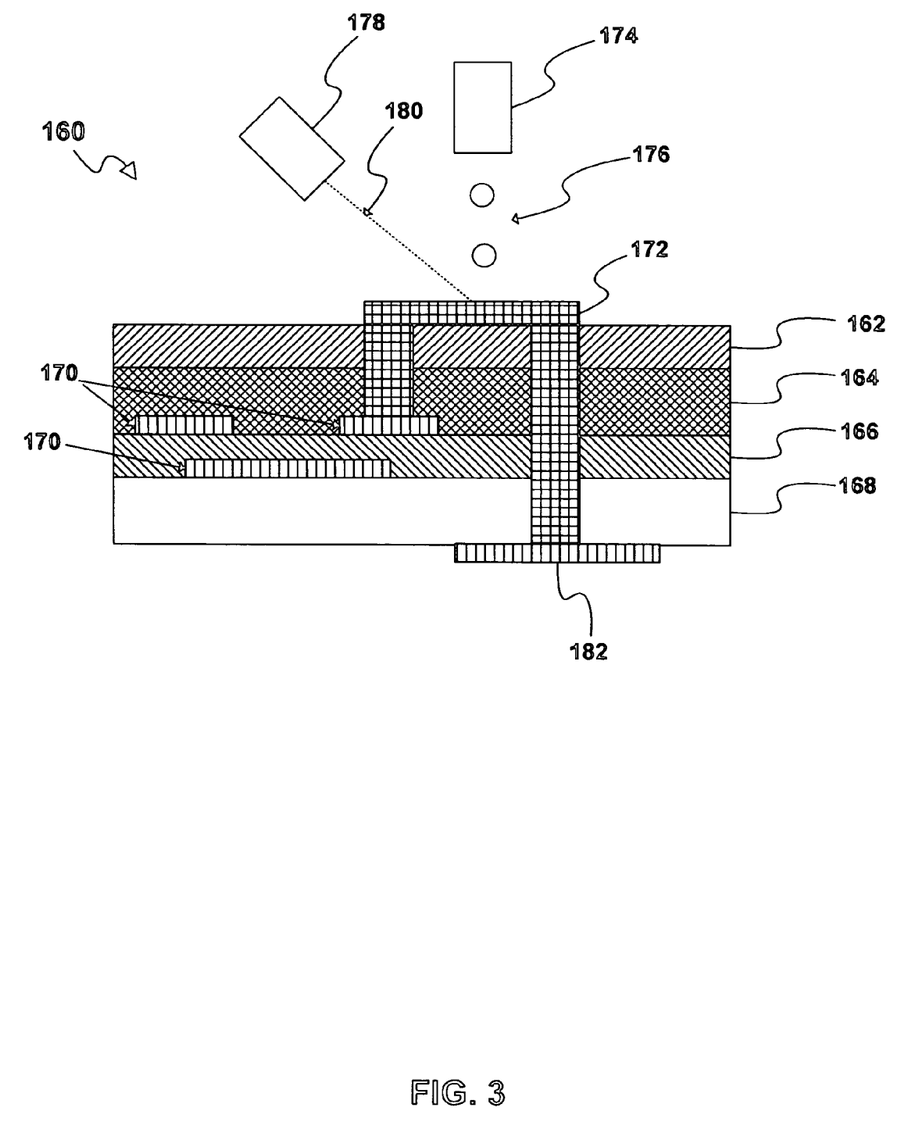
FIG. 3 is a cross-sectional view of yet another embodiment of a device with an interconnect formed thereon.

Referring now to FIG. 3, there is illustrated a cross-sectional view of yet another embodiment of an electronic device in a stage of formation. Illustrated in FIG. 3 is device 160, comprising a substrate 168 with a thin film transistor device formed thereon, which may comprise a gate electrode 170, a dielectric layer such as a gate dielectric layer 166, drain and source electrode 170, semiconductor layer 164, and a passivation layer 162, for example, although claimed subject matter is not so limited. Additionally, in this embodiment, formed on the opposing side of substrate 168 is an electrode 182, which may form a component of another electronic device (not shown), for example. An interconnect 172, which is formed at least partially in a via, may provide electrical connectivity between one or more electrodes 170, and electrode 182, for example.

Although claimed subject matter is not limited to any particular material and/or combination of materials to form one or more of the layers and/or devices illustrated in FIG. 3, in at least one embodiment, substrate 168 may comprise a substrate of glass and/or plastic, as just a few examples, and may additionally comprise any combination of materials, such as polycarbonate, polyacrylate, polyimide, polyolefin, polyestersulfone, polyester, polyethylene terephthalate (PET) or polyethylene naphthalate (PEN), and/or polyethersulfone (PES), but it is desirable to note that claimed subject matter is not limited in this respect, and may comprise any material suitable for use as a substrate, such as any material exhibiting properties suitable for application as a substrate in an electronic device, for example. In one particular embodiment, a substrate may comprise a material or combination of materials that is typically lower cost as compared to other types of materials, and these particular lower cost substrates may be particularly sensitive to high temperatures. In this embodiment, substrate 168 may be thin enough to allow laser ablation to penetrate the substrate. Additionally, device layer 166 may comprise a layer substantially comprising dielectric material, and may comprise organic and/or inorganic material, for example. In at least one embodiment, device layer 164 may comprise one or more organic dielectrics, such as poly(vinylphenol), also called PVP, and/or one or more inorganic dielectrics, such as a metal oxide, including $Al_2O_3$ and/o $SiO_2$, which may be in sol-gel and/or nanoparticle form, as just a few examples. Additionally, electrodes 170 and/or 182 may be comprised of one or more types of materials, such as organic and/or inorganic materials, including poly(3,4-ethylenedioxythiophene), also called PEDOT, and/or one or more types of metal in nanoparticle suspensions, such as Cu, Al, Ni, and/or Cr and/or organo-metallic solutions, such as Cu formate hydrate in water, as just a few examples. Additionally, device layer 164 may be comprised of one or more organic and/or inorganic semiconductive materials, including, for example, poly (3-hexylthiophene-2,5-diyl) in chloroform, pentacene, ZnO and/or CdSe, as just a few examples. Additionally, device layer 162 may comprise a layer substantially comprising dielectric material, and may comprise organic and/or inorganic material, for example. In at least one embodiment, device layer 168 may comprise one or more organic dielectrics, such as PVP and/or acrylic, and/or one or more metal oxides, including $Al_2O_3$ and/or $SiO_2$, which may be in sol-gel and/or nanoparticle forms, as just a few examples. Additionally, although numerous differing types of materials may be utilized to form interconnections, such as interconnect 172, in at least one embodiment, at least one material may comprise one or more types of materials, such as organic and/or inorganic materials, including poly(3,4-ethylenedioxythiophene), also called PEDOT, and/or one or more types of metal in nanoparticle suspensions, such as Cu, Al, Ni, and/or Cr and/or organo-metallic solutions, such as Cu formate hydrate in water, as just a few examples. In at least one embodiment, one or more materials may comprise a suspension of nanoparticles in solvent, such as a nanoparticle suspension comprising 30% by weight of gold nanoparticles suspended in toluene, for example, and one or more sintering processes may be utilized to at least partially form an interconnect, for example. Again, particular methods of formation may be better understood when explained with reference to FIG. 4 below.

As stated previously, one or more components of a device, such as one or more electrodes 170 and/or 182 formed on device 160, may be interconnected by an interconnect, such as interconnect 172, to form a circuit, for example. In one particular embodiment, electromagnetic radiation may be utilized to remove at least a portion of one or more layers, and may comprise one or more laser ablation processes, for example. In this embodiment, one or more laser ablation processes may be performed by a laser 178, resulting in the removal of at least a portion of layers 162, 164, 166 and/or 168, for example, such as to expose at least a portion of at least one electrode 170 and/or 182, resulting in the creation of two vias, for example. In this embodiment, a laser 178 may be configured to provide electromagnetic radiation 180 to at least a portion of device 160, and may, in this particular embodiment, provide a beam substantially normal to the surface of device layer 168, for example, which may result in the laser ablation of at least a portion of device 160, for example, although, of course, claimed subject matter is not limited in scope in this respect. Additionally, an ejection device 174 may provide material 176 to at least partially form interconnect 172, such as by ejecting material 176 at least partially to the vias formed by the laser 178, for example. Additionally, depending at least in part on the material and/or combination of materials used to form interconnect 172, laser 178 may provide a beam at an acute angle from the surface of device layer 168, for example, and may be utilized to apply electromagnetic radiation 180 to material 176 provided by the ejection device 174, which may result in at least a portion of material 176 being altered, such as physically and/or chemically, such as by re-crystallization, sintering and/or decomposition, for example, resulting in, for this example, material 176 becoming a substantially singular mass, and forming interconnect 172, for example.

Although illustrated as having a particular configuration in FIGS. 1, 2 and 3, the thin film transistor embodiment is illustrated as having a bottom-gate bottom-contact configuration, meaning, in this context, that the gate electrode is configured under the dielectric layer and the drain/source electrodes are configured under the semiconductor layer, it is desirable to note that claimed subject matter is not limited to this configuration. For example, particular embodiments of claimed subject matter may also be utilized in a thin film transistor in other configurations, such as a bottom-gate top contact configuration in which the drain/source electrodes may be configured on the top of the semiconductor layer and are covered by the passivation layer, for example.

The devices illustrated in FIGS. 1, 2 and/or 3 may be formed by use of a computer controlled formation system (not shown), which may be capable of providing electromagnetic radiation and/or conductive material to at least a portion of one or more devices, such as those illustrated in the foregoing figures. A formation system used to form one or more of the illustrated devices may, for example, comprise a laser capable of generating a laser beam at a frequency in the electromagnetic spectrum and having suitable energy to provide intense localized or "spot" heating, for example, such as laser 178 of FIG. 3, for example. Additionally, a formation system used to form one or more of the illustrated devices may comprise an ejection device, such as ejection device 174 of FIG. 3, which may comprise a jetting device, and may be configured to apply material, such as conductive material, to locations on a device, such as at least partially in a via, such as via 118 and/or via 152 of FIGS. 1b and 2b, for example.

Figure 4:
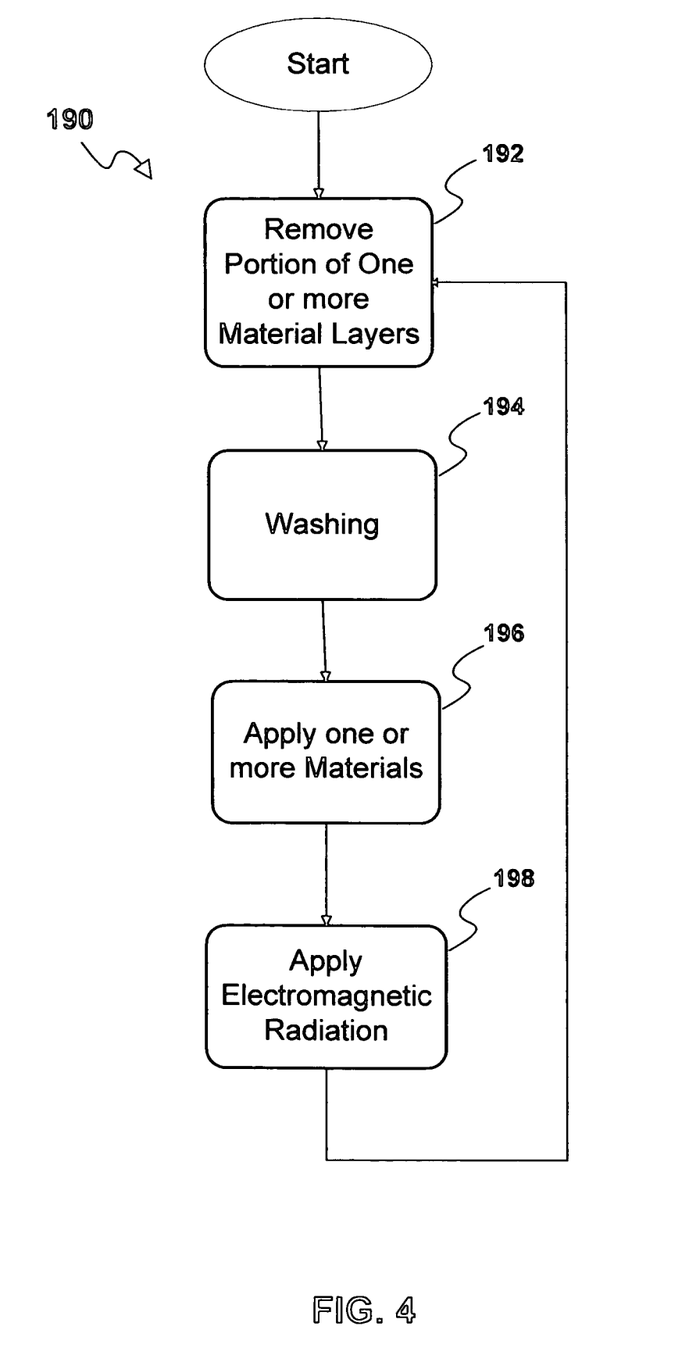
FIG. 4 is a flowchart illustrating an embodiment of a method for forming an interconnect.

Referring now to FIG. 4, one embodiment of a technique for forming an interconnect is illustrated by a flowchart, although, of course, claimed subject matter is not limited in scope in this respect. Such an embodiment may be employed to at least partially form an interconnect, as described below. The flowchart illustrated in FIG. 4 may be used to form a device at least in part, such as device 120 of FIG. 1c, device 156 of FIG. 2c, and/or device 160 of FIG. 3, for example, although claimed subject matter is not limited in this respect. Likewise, the order in which the blocks are presented does not necessarily limit claimed subject matter to any particular order. Additionally, intervening blocks not shown may be employed without departing from the scope of claimed subject matter.

Flowchart 190 depicted in FIG. 4 may, in alternative embodiments, be implemented in software, hardware and/or firmware, such as the aforementioned computer controlled formation system, for example, and may comprise discrete and/or continual operations. In this embodiment, at block 192, at least a portion of one or more material layers of a partially formed thin film transistor may be removed, such as by laser ablation, for example. At block 194, a washing operation may be performed to remove debris and/or byproducts of the removal performed at block 192, although in alternative embodiments, no washing may be performed, for example. At block 196, one or more materials may be applied, such as by an ejection device, and may be applied to one or more areas where portions of one or more material layers are removed, such as at block 192, for example. At block 198, laser radiation may be applied to the one or more applied materials, such as immediately subsequent to the application of one or more of the materials, or after a particular duration, for example, which may result in sintering at least a portion of the applied materials, for example, although in alternative embodiments, no laser radiation may be applied to the one or more applied materials, for example. In at least one embodiment, one or more of the aforementioned operations may be repeated, such as in a substantially continuous manner, such as to form a thin film transistor as illustrated in FIG. 1c, FIG. 2c, and/or FIG. 3, for example.

An at least partially formed thin film device, such as a thin film transistor, in at least one embodiment, may be formed from one or more processes, and/or numerous process operations, but claimed subject matter is not limited to any particular method of formation of one or more layers of a partially formed thin film transistor. A substrate, such as a substrate of glass and/or plastic, for example, may be provided, and one or more deposition processes, such as one or more thermal evaporation, sputter, chemical vapor deposition (CVD), electro-plating, electroless plating, inkjet printing, screen printing, and/or spin coating deposition processes may be utilized to form a material layer or one or more electrodes, for example. One or more of these processes may be repeated, such as to form one or more additional electrodes and/or material layers, for example, resulting in the formation of a multi-layer at least partially formed thin film transistor, in at least one embodiment. However, claimed subject matter is not limited to any particular method or combination of methods to form a device suitable for use in one or more of the following operations, for example.

Removing a portion of one or more material layers may comprise removing a portion of one or more layers of an at least partially fabricated thin film transistor, for example, and may comprise one or more removal processes. In one particular embodiment, an electromagnetic radiation source, such as laser 178 of FIG. 3, may be utilized to perform at least a portion of the removal, and may comprise one or more laser ablation processes, for example. In this particular embodiment, an electromagnetic radiation source may comprise a laser source, and the laser source may be configured to provide electromagnetic radiation to portions of a device, such as to one or more portions of an at least partially formed thin film transistor, as illustrated in FIGS. 1, 2 and/or 3, for example. Additionally, one or more mirrors, optical fibers and/or masks may be utilized to provide, direct and/or block electromagnetic radiation, for example, and use of these components may depend at least in part on the particular type of laser utilized and/or the particular type of device being formed, for example. In this embodiment, a laser source may be configured to provide laser radiation having a fluence, wavelength, intensity, peak power, and/or duration, and one or more of these characteristics may be selected based at least in part on particular material properties, including the absorptivity and/or absorption depth of the materials, for example. The laser radiation may, depending at least in part on the type of material, result in vaporizing a portion of the material, for example, and particular polymer materials may undergo chemical changes, such as photochemical changes, including decomposition, for example. In at least one embodiment, one or more of the aforementioned characteristics of a laser source may be varied if multiple types of materials are to be removed, for example, and/or if varying effects are desirable. In one particular embodiment, a laser having a wavelength of approximately 248 nanometers may be utilized to at least partially form a via in a material layer substantially comprising PVP, for example, although, of course, claimed subject matter is not so limited.

Continuing with this embodiment, at block 194, at least a portion of one or more material layers may be washed, such as to remove one or more byproducts of ablation, for example. Numerous methods exist or may be developed later for washing one or more material layers, including spraying, immersion, and/or scrubbing, for example, but particular methods for washing may depend at least in part on the material layers and/or the particular removal processes performed at block 192, for example. Additionally, in alternative embodiments, no washing may be performed, and, in this embodiment, one or more operations of block 196 may be performed after one or more removal processes of block 192, for example.

At block 196, applying one or more materials may comprise selectively applying one or more materials to one or more portions of one or more material layers, such as conductive material, for example, resulting in the formation of one or more interconnects, in at least one embodiment. In this embodiment, an interconnect may be formed to be electrically coupled with one or more electrodes, for example, resulting in the formation of a circuit, in at least one embodiment. In at least one embodiment, an ejection device, such as a jetting device, may provide material, such as by ejecting material, such as in the form of drops, at least partially to a via formed at block 192, for example. Additionally, depending at least in part on the material and/or combination of materials used to form an interconnect, at block 198, one or more lasers may be utilized to apply electromagnetic radiation to the one or more materials provided by the ejection device. For example, after a particular amount of material is provided at block 196, a laser may provide laser radiation to the material at block 198, which may result in at least a portion of the material being altered, such as physically and/or chemically, such as by re-crystallization, sintering, and/or decomposition, for example, resulting in the formation of a portion of an interconnect, for example. One or more of the foregoing operations may be repeated, for example, and, thus, a circuit comprising multiple thin film transistors may be formed, such as one or more of the devices illustrated in FIGS. 1, 2 and/or 3.

It is, of course, now appreciated, based at least in part on the foregoing disclosure, that software may be produced capable of performing a variety of operations, including one or more of the foregoing operations. It will, of course, also be understood that, although particular embodiments have just been described, claimed subject matter is not limited in scope to a particular embodiment or implementation. For example, one embodiment may be in hardware, such as implemented to operate on a device or combination of devices as previously described, for example, whereas another embodiment may be in software. Likewise, an embodiment may be implemented in firmware, or as any combination of hardware, software, and/or firmware, for example. Additionally, all or a portion of one embodiment may be implemented to operate at least partially in one device, such as a laser, an ejection device, and/or at least partially in a computing device, for example. Likewise, although claimed subject matter is not limited in scope in this respect, one embodiment may comprise one or more articles, such as a storage medium or storage media. This storage media, such as, one or more CD-ROMs and/or disks, for example, may have stored thereon instructions, that when executed by a system, such as a computer system, computing platform, and/or other system, for example, may result in an embodiment of a method in accordance with claimed subject matter being executed, such as one of the embodiments previously described, for example. As one potential example, a computing platform may include one or more processing units or processors, one or more input/ output devices, such as a display, a keyboard and/or a mouse, and/or one or more memories, such as static random access memory, dynamic random access memory, flash memory, and/or a hard drive, although, again, claimed subject matter is not limited in scope to this example.

In the preceding description, various aspects of claimed subject matter have been described. For purposes of explanation, specific numbers, systems and/or configurations were set forth to provide a thorough understanding of claimed subject matter. However, it should be apparent to one skilled in the art having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

The invention claimed is:

1. A method, comprising:
    applying electromagnetic radiation to one or more portions of a multilayer device to ablate said one or more portions of said multilayer device;
    selectively applying one or more materials to said multilayer device near where said ablation occurred; and
    providing electromagnetic radiation to said one or more materials to cure a portion of said material to form at least a portion of an interconnect.

2. The method of claim 1, wherein said electromagnetic radiation comprises laser radiation, and wherein said laser radiation is provided by a laser.

3. The method of claim 1, wherein said multilayer device comprises two or more layers, wherein at least a portion of at least one layer comprises one or more of: glass, plastic, polycarbonate, polyacrylate, polyimide, polyolefin, polyestersulfone, polyester, polyethylene terephthalate (PET), polyethylene naphthalate (PEN), and/or polyethersulfone (PES).

4. The method of claim 1, wherein said interconnect provides interconnection between two or more electrodes included within said multilayer device, wherein said two or more electrodes are at least partially comprised of one or more of: organic and/or inorganic materials, and/or one or more metals, in one or more nanoparticle suspensions and/or organo-metallic solutions.

5. The method of claim 1, wherein said multilayer device comprises a dielectric layer, wherein at least a portion of the dielectric layer comprises one or more of: organic dielectrics, and/or one or more inorganic dielectrics, in sol-gel and/or nanoparticle form.

6. The method of claim 1, wherein said multilayer device comprises a layer substantially comprising a passivation/ protection layer, wherein at least a portion of the passivation/ protection comprises one or more of: one or more organic dielectrics and/or one or more inorganic dielectrics, in sol-gel form and/or in nanoparticle form.

7. The method of claim 1, wherein said selectively applying is substantially performed by an ejection device.

8. The method of claim 7, wherein said ejection device comprises a jetting device.

9. The method of claim 1, wherein at least one of said one or more materials comprises a suspension of conductive particles at least partially suspended in a solvent.

10. The method of claim 9, wherein said suspension comprises nanoparticles of gold suspended in a solvent of toluene, wherein said nanoparticles of gold comprise approximately 30% of said solution by weight.

11. The method of claim 4, wherein at least one of said two or more electrodes substantially comprise at least a portion of a thin film transistor.

12. A method, comprising:
    a step for irradiating a portion of a multilayer device to ablate said portion;
    a step for placing material onto said multilayer device; and
    a step for curing said material, wherein said cured material at least partially comprises an interconnect, wherein said interconnect is capable of providing interconnection between two or more electrodes included within said multilayer device, wherein at least one of said two or more electrodes is at least partially comprised of one or more of: organic and/or inorganic materials, and/or one or more metals, in one or more nanoparticle suspensions and/or organo-metallic solutions.

13. The method of claim 12, wherein said step for placing is substantially performed by an ejection device.

14. The method of claim 13, wherein said ejection device comprises a jetting device.

15. The method of claim 12, wherein at least one of said one or more materials comprises a suspension of conductive particles at least partially suspended in a solvent.

16. The method of claim 15, wherein said suspension comprises nanoparticles of gold suspended in a solvent of toluene, wherein said nanoparticles of gold comprise approximately 30% of said solution by weight.

17. The method of claim 12, wherein at least one of said two or more electrodes substantially comprises at least a portion of a thin film transistor.

18. The method of claim 4, wherein the organic and/or inorganic materials comprise poly(3,4-ethylenedioxythiophene) (PEDOT).

19. The method of claim 4, wherein each of the one or more metals is selected from the list consisting of Cu, Al, Ni, Cr, and combinations thereof.

20. The method of claim 5, wherein the organic dielectrics, if any, include poly(vinylphenol).

21. The method of claim 5, wherein the one or more inorganic dielectrics comprise a metal oxide in sol-gel form and/or in nanoparticle form.

22. The method of claim 21, wherein the metal oxide, if any, includes $Al_2O_3$ and/or $SiO_2$.

23. The method of claim 12, wherein the organic and/or inorganic materials comprise poly(3,4-ethylenedioxythiophene) (PEDOT).

* * * * *